(12) United States Patent
Kuroda et al.

(10) Patent No.: US 7,768,790 B2
(45) Date of Patent: Aug. 3, 2010

(54) ELECTRONIC CIRCUIT

(75) Inventors: Tadahiro Kuroda, Yokohama (JP);
Daisuke Mizoguchi, Yokohama (JP);
Yusmeeraz Binti Yusof, Yokohama (JP);
Noriyuki Miura, Yokohama (JP);
Takayasu Sakurai, Tokyo (JP)

(73) Assignee: KEIO University, Tokyo (JP)

( * ) Notice: Subject to any disclaimer, the term of this patent is extended or adjusted under 35 U.S.C. 154(b) by 345 days.

(21) Appl. No.: 10/588,769

(22) PCT Filed: Feb. 14, 2005

(86) PCT No.: PCT/JP2005/002117

§ 371 (c)(1),
(2), (4) Date: May 7, 2007

(87) PCT Pub. No.: WO2005/078795

PCT Pub. Date: Aug. 25, 2005

(65) Prior Publication Data

US 2007/0289772 A1 Dec. 20, 2007

(30) Foreign Application Priority Data

Feb. 13, 2004 (JP) .............................. 2004-037242

(51) Int. Cl.
*H05K 7/00* (2006.01)
(52) U.S. Cl. ...................................... 361/760; 174/260
(58) Field of Classification Search .................. 174/260, 174/262; 361/760
See application file for complete search history.

(56) References Cited

U.S. PATENT DOCUMENTS 5,701,037 A    12/1997    Weber et al.

(Continued)

FOREIGN PATENT DOCUMENTS

JP    11-68033    3/1999

(Continued)

OTHER PUBLICATIONS

Japanese Office Action, Feb. 27, 2008, issued in JP 2004-037242.

(Continued)

*Primary Examiner*—Jeremy C Norris
*Assistant Examiner*—Yuriy Semenenko
(74) *Attorney, Agent, or Firm*—Edwards Angell Palmer & Dodge LLP

(57) ABSTRACT

An electronic circuit capable of efficiently transmitting signals in a case where signals are transmitted over substrates with three or more substrates three-dimensionally mounted. In the present invention, LSI chips are stacked in three layers, and a bus is formed over three chips. The first through the third transmitter coils 13a, 13b, 13c and the first through the third receiver coils 15a, 15b, 15c are formed by wiring on the first through the third LSI chips 11a, 11b, 11c. These three pairs of transmitter and receiver coils are disposed so that the centers of the openings thereof are coincident with each other, whereby three pairs of transmitter and receiver coils 13 and 15 form inductive coupling to enable communications. The first through the third transmitter circuits 12a, 12b, 12c are connected to the first through the third transmitter coils 13a, 13b and 13c, respectively, and the first through the third receiver circuits 14a, 14b, 14c are connected to the first through the third receiver coils 15a, 15b, 15c, respectively.

6 Claims, 5 Drawing Sheets

U.S. PATENT DOCUMENTS

| | | | |
|---|---|---|---|
| 6,000,128 A * | 12/1999 | Umeno et al. | 29/846 |
| 6,903,578 B2 * | 6/2005 | Haigh et al. | 326/82 |
| 7,460,604 B2 * | 12/2008 | Dupuis | 375/258 |
| 2006/0038544 A1 * | 2/2006 | Sakurai et al. | 323/282 |

FOREIGN PATENT DOCUMENTS

| | | |
|---|---|---|
| JP | 2000-124406 | 4/2000 |
| JP | 2002-252324 | 9/2002 |
| JP | 2002-368118 | 12/2002 |

OTHER PUBLICATIONS

K. Onizuka, et al.; "A Study on Chip-to-Chip Wireless Power Transmission;" *2003 Nen The Institute of Electronics, Information and Communication Engineers Kiso • Kyokai Society Taikai Koen Ronbunshu*; Sep. 10, 2003; p. 3.

K. Kanda, et al.; "1.27 Gb/s/pin, 3mW/pin Wireless Superconnect (WSC) Interface Scheme;" *The Institute of Electronics, Information and Communication Engineers Gijutsu Kenkyu Hokoku*; vol. 103; No. 88 (ICD2003-16); May 2003; pp. 19-22.

K. Kanda, et al.; *2003 IEEE International Solid-State Circuits Conference ISSCC 2003/ Sesion 10/ High Speed Building Blocks/Paper 10.7*; vol. 1; 2003; (10 Sheets.).

* cited by examiner

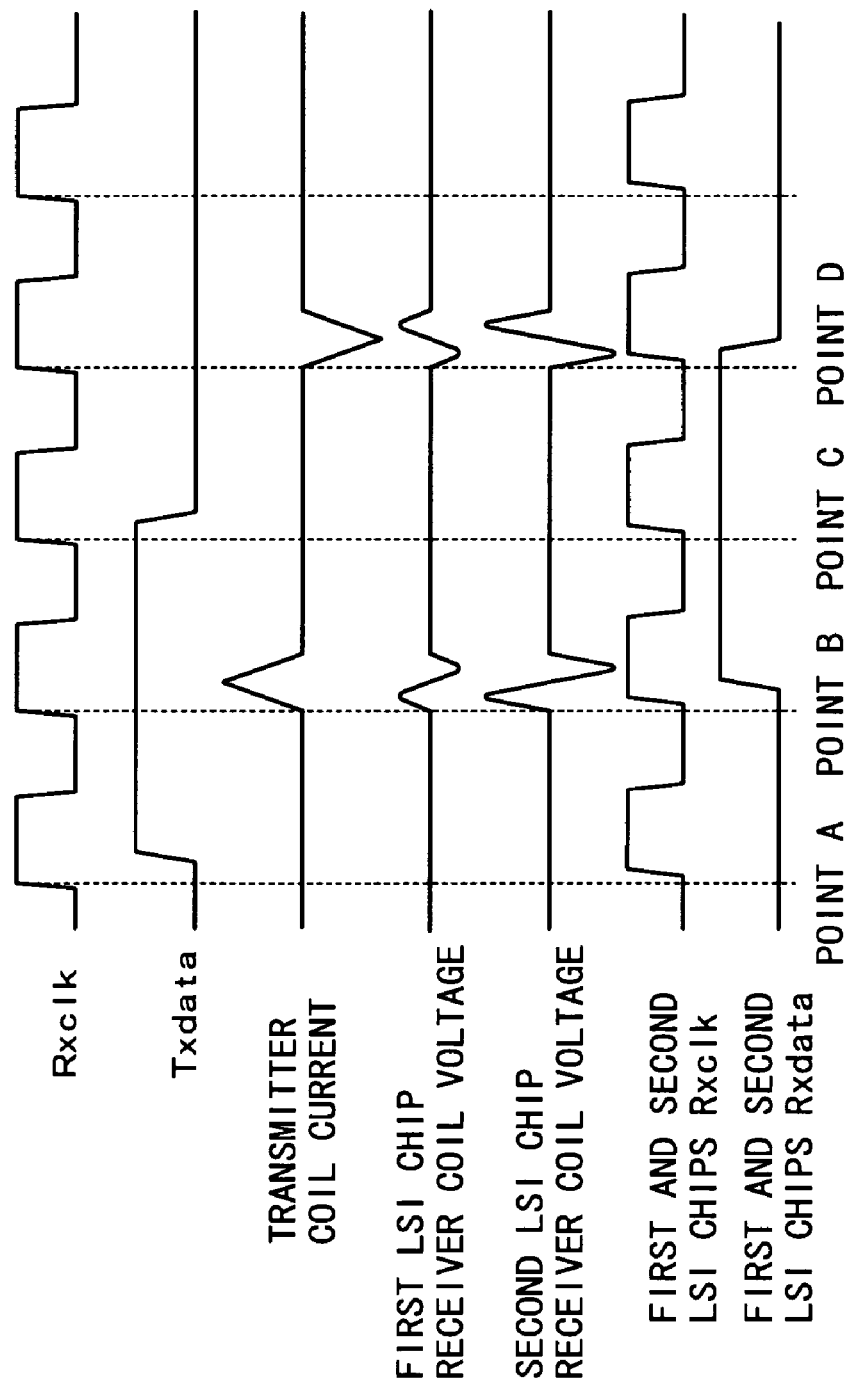

ELECTRONIC CIRCUIT

BACKGROUND OF THE INVENTION

1. Field of the Invention

The present invention relates to an electronic circuit that is capable of suitably carrying out communications between substrates such as IC (Integrated Circuit) bare chips, and PCBs (Printed Circuit Boards).

2. Description of the Related Art

Downsizing and high performance have been further advanced in recent electronic devices. In line therewith, incorporated LSIs (Large Scale Integration) have been downsized and high speed processing has progressed. As means for achieving downsizing and high-speed processing, it is desirable that entire functions are included in one package, and now generally two types of realization methods exist.

As the first method, a system called "system on chip (SoC)" is available, which incorporates the entire system on a single bare chip. This system is made expensive because different process technologies are realized on one bare chip, and the yield thereof is lowered due to an increase in the chip area.

As the second method, a system called "system in package (SiP)" is available, which seals a plurality of bare chips in one package. With this technique, it is expected that separate chips realize functions produced through different processes, wherein the yield per bare chip is increased, and production costs can be made inexpensive. However, since it becomes necessary that different chips are interconnected to each other, three types of connection techniques exist.

The first method for interconnection in SiP is a method conventionally using wire bonding. In this case, the number of connections between chips is the same as in a conventional package or less, wherein a problem occurs in the communications bandwidth. In addition, three-dimensional mounting is indispensable when reducing the mounting area, wherein since, in the wire bonding system, it is necessary to make chips smaller that are to be stacked up, it is difficult to form a bus because the mounting area is restricted and major connections are based on one-to-one connection.

The second method for interconnection in SiP is a method by which chips are three-dimensionally mounted, and connections are based on micro bumps. In this method, costs up to face-to-face mounting of two chips are inexpensive. However, as regards mounting of three or more chips, it is necessary to physically produce a communications path passing through a chip itself or a build-up substrate, a so-called "through hole," wherein an exclusive process technology and highly precise processing accuracy are demanded: resulting in an increase in production costs.

The third method for interconnection in SiP is a method for three-dimensionally mounting chips and electrically connecting chips by means of capacitive coupling. Although, for face-to-face mounting up to two chips, costs thereof are inexpensive and high-speed communications are possible, transmission efficiency of signals is radically worsened in three or more chips, wherein power consumption is increased.

For this reason, it is proposed that communications between chips are carried out by means of an antenna (for example, refer to Patent Document 1).

[Patent Document 1] Japanese Unexamined Patent Application Publication No. H11-68033

However, even in the case of using an antenna, where signals are attempted to be transmitted over chips with three or more chips mounted, it is necessary that an electric field generated by the antenna passes through a number of substances whose dielectric constants are different from each other (biased silicon substrate, doped silicon, oxide film, nitride film, etc.), wherein reflection is generated at a boundary phase, resulting in a worsening in transmission efficiency.

In view of the above-described problems, it is therefore an object of the present invention to provide an electronic circuit capable of efficiently transmitting signals even in a case where signals are transmitted over substrates with three or more substrates three-dimensionally mounted. The substrates include an IC bare chip and a PCB.

SUMMARY OF THE INVENTION

An electronic circuit according to the invention comprising a first substrate including a first coil that is formed by wiring on a substrate and a second substrate including a second coil that is formed by wiring on a substrate at a position corresponding to the first coil, and is inductively coupled to the first coil.

In addition, because the first substrate also includes a transmitter circuit for outputting signals to the first coil when transmission digital data changes, power consumption can be reduced.

Also, because the second substrate further includes a receiver circuit that connects both ends of the second coil to a predetermined voltage source via resistors, the center voltage of voltage amplitude occurring at both ends of the receiver coil when receiving signals can be made into a voltage value optimal for the signal amplitude.

Further, because the first coil is inductively coupled to the second coils of a plurality of second substrates, a bus over three or more substrates can be formed.

Still further, because the second substrate also includes a receiver circuit that receives signals only for a predetermined cyclic period, it is possible to increase the SN ratio.

According to the present invention, it is possible to efficiently transmit signals where signals are transmitted over substrates with three or more substrates three-dimensionally mounted.

Also, because communications are carried out by current drive, the electronic circuit according to the present invention can be favorably employed for LSIs, and the like in which low voltage drive is highly demanded.

The present specification includes the contents described in the specification and/or the drawings of Japanese Patent Application No. 2004-037242 which is the basis of priority of the present application.

BRIEF DESCRIPTION OF THE DRAWINGS

FIG. 3 is a view depicting waveforms for describing actions of the embodiment;

DESCRIPTION OF REFERENCE SYMBOLS

Figure 1:
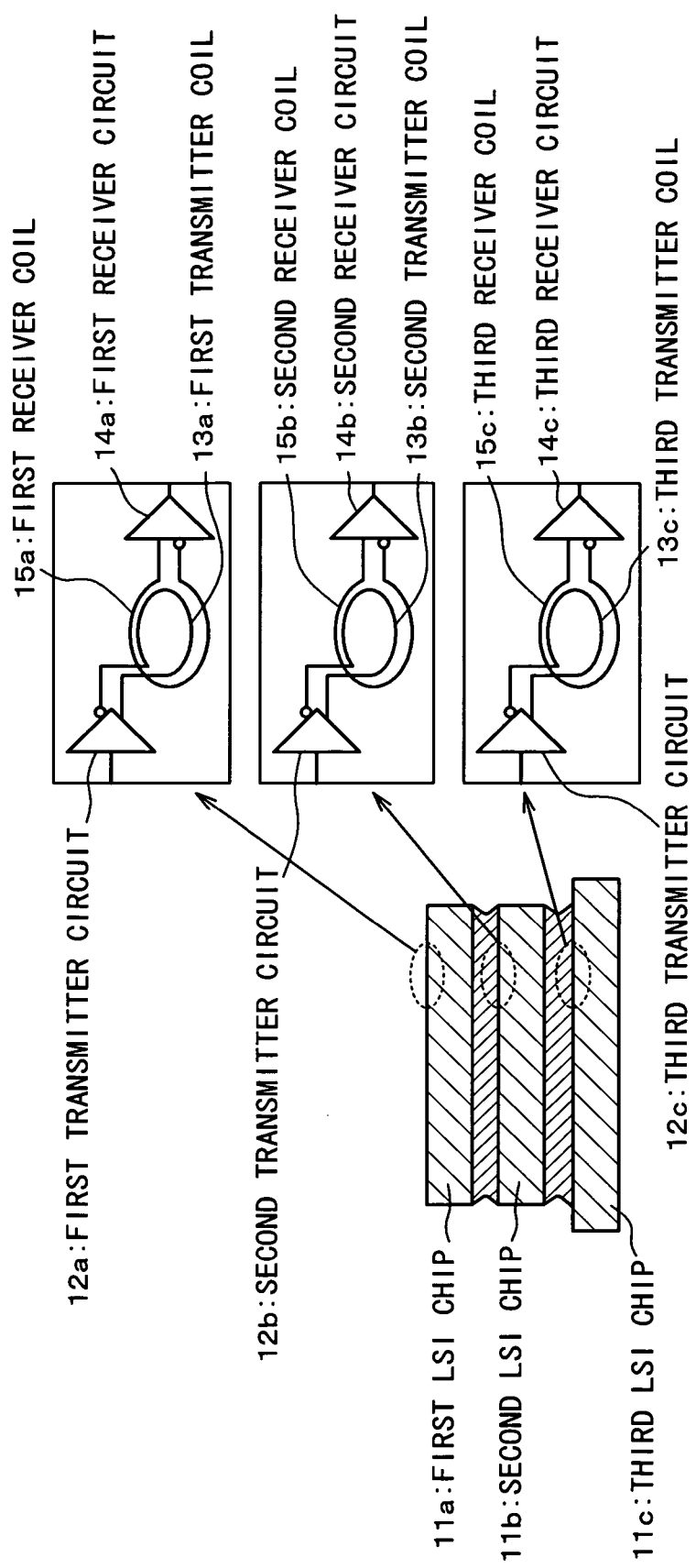
FIG. 1 is a view depicting a configuration of an electronic circuit according to one embodiment of the present invention.

11 LSI chip
12 Transmitter circuit
13 Transmitter coil
14 Receiver circuit
15 Receiver coil
400, 401 Transmitter/receiver circuits
403 Inductive coupling
410, 411, 412, 420, 421, 422, 423 LSI chips
501 Transmitter/receiver circuit
503 Inductive coupling
510, 511, 512 LSI chips
FF Memory element
INV Buffer
NAND NAND circuit
L Coil
T Transistor
Rxclk Receiving clock
Rxdata Receiving data
Txclk Transmission clock
Txdata Transmission data
Vbias Bias voltage

BEST MODE FOR CARRYING OUT THE INVENTION

Hereinafter, a detailed description is given of preferred embodiments of the present invention with reference to the accompanying drawings.

FIG. 1 is a view depicting a configuration of an electronic circuit according to one embodiment of the present invention. The electronic circuit according to the present embodiment is composed of a first LSI chip 11a, a second LSI chip 11b and a third LSI chip 11c. This is an example in which LSI chips are stacked up in three layers and a bus is formed so as to lie across three chips. The first through the third LSI chips 11a, 11b and 11c are vertically stacked up, and the respective chips are fixed to each other with an adhesive agent. The first through the third transmitter coils 13a, 13b and 13c, which are respectively used for transmission, are formed by wiring on the first through the third LSI chips 11a, 11b and 11c, and also, the first through the third receiver coils 15a, 15b and 15c, which are respectively used for receiving, are formed by wiring thereon. These coils are disposed on the first through the third LSI chips 11a, 11b and 11c so that the centers of openings of these three pairs of transmitter and receiver coils 13 and 15 are made coincident with each other. Accordingly, the three pairs of transmitter and receiver coils 13 and 15 form inductive coupling, thereby enabling communications. The first through the third transmitter circuits 12a, 12b and 12c are connected to the first through the third transmitter coils 13a, 13b and 13c respectively, and the first through the third receiver circuits 14a, 14b and 14c are connected to the first through the third receiver coils 15a, 15b and 15c respectively. The transmitter and receiver coils 13 and 15 are three-dimensionally mounted as coils having one or more turns in an area permitted for communications, utilizing a multi-layered wiring of a process technology. A profile best suitable for communications exists in the transmitter and receiver coils 13 and 15, and it is necessary that they have an optimal number of times of winging, optimal opening, and optimal line width. Generally, the transmitter coils 13 are smaller than the receiver coils 15.

Figure 2:
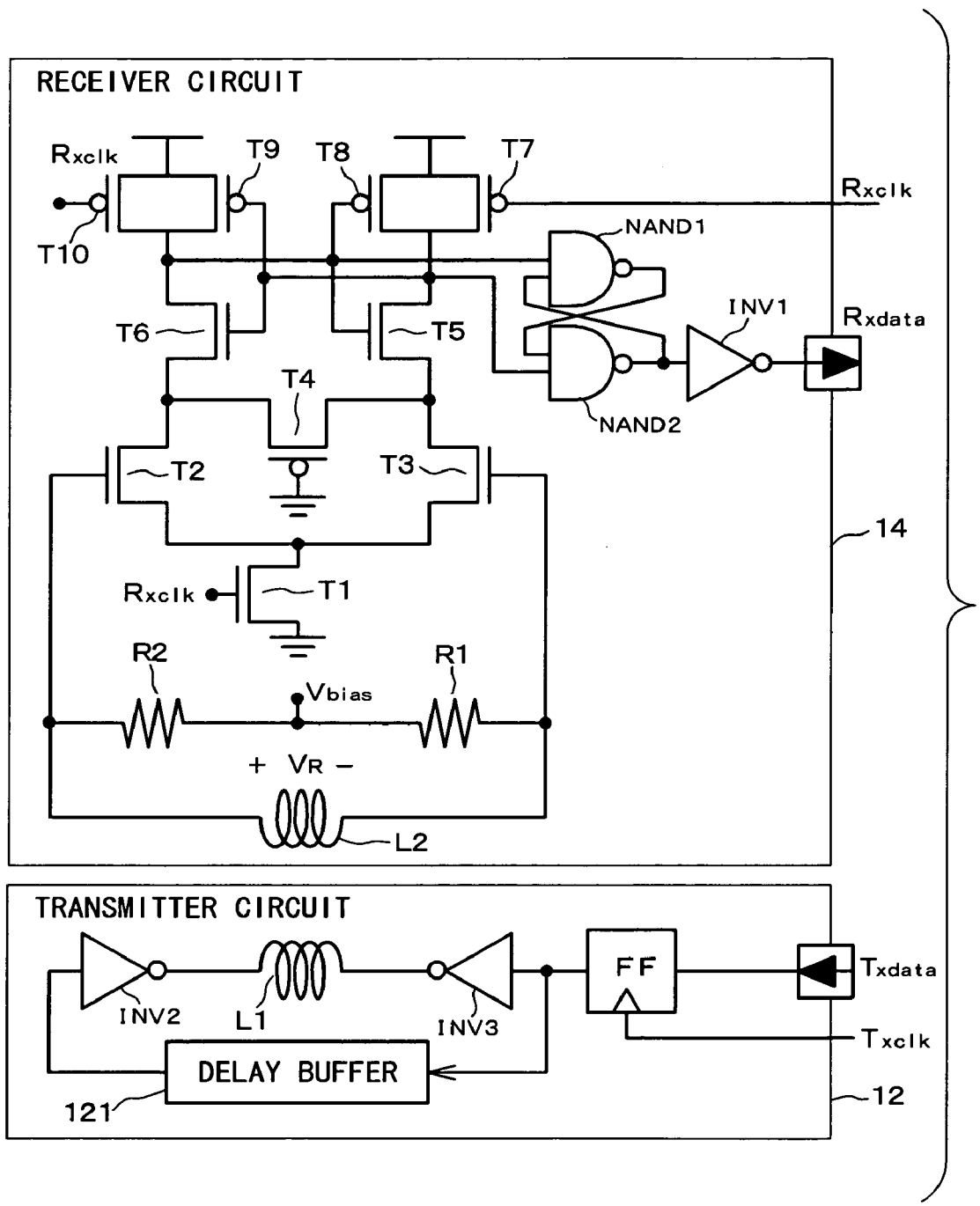
FIG. 2 is a view depicting a detailed configuration of a transmitter circuit and a receiver circuit in the present embodiment.

FIG. 2 is a view depicting a detailed configuration of a transmitter circuit and a receiver circuit according to the present embodiment. A transmitter circuit 12 according to the present embodiment is composed of a memory element FF, a delay buffer 121, a first transmission buffer INV2, and a second transmission buffer INV3. Reference number L1 denotes a transmitter coil 13. The transmitter circuit 12 takes a transmission clock (synchronization signal) Txclk as an input and transmission data Txdata synchronized therewith. Inputted transmission data Txdata are stored in the memory element FF and are inputted into the first and the second transmission buffers INV2 and INV3. However, it is constructed so that a delay buffer 121 operating as a delay element is provided prior to the first transmission buffer INV2, and a difference is brought about between the input times into the first transmission buffer INV2 and the second transmission buffer INV3. Outputs of the first transmission buffer INV2 and the second transmission buffer INV3 are, respectively, connected to both ends of the transmitter coil L1. With the construction, only when a change occurs in the transmission data, a current is permitted to flow into the coil L1 only for the period of a signal propagation delay time of the delay buffer 121. In order to make the receiving voltage of the receiver coil 15 maximum and the margin of the receiving timing larger, the drive forces of the first and the second transmission buffers INV2 and INV3 are set so that the current waveform to the transmitter coil L1 is made into a triangular wave.

The receiver circuit 14 is composed of transistors T1 through T10, resistors R1 and R2, NAND circuits NAND1 and NAND2, and a receiving buffer INV1; and forms a latched differential amplifier in its entirety. Reference number L2 denotes a receiver coil 15. It takes a receiving clock (synchronization signal) Rxclk externally and outputs receiving data Rxdata. The transistors T2 and T3 constitute a differential pair of the differential amplifier, and receive signals from the receiver coil L2. Both ends of the receiver coil L2, that is connected to the transistors T2 and T3, are connected to a bias voltage Vbias through the resistors R1 and R2, whereby the center voltage of voltage amplitude occurring at both ends of the receiver coil L2 when receiving signals can be made into a voltage value Vbias optimized for signal amplification. Source terminals of the transistors T2 and T3 are connected to a transistor T1 for generation of tail current source. The source terminal of the transistor T1 is grounded, and a receiving clock Rxclk is inputted into the gate terminal. At the drain side of the transistors T2 and T3, transistors T5 and T8 and transistors T6 and T9, respectively, form an inverter. The two inverters are connected in the form of a loop. Wiring connecting the inverters is inputted into the NAND circuits NAND1 and NAND2, and the NAND circuits NAND1 and NAND2 form latching. Data received by the differential amplifier change values in synchronization with the receiving clock Rxclk inputted into the transistor T1. The values of the receiving signals are picked up as digital data only when the values change due to the NAND circuit NAND1 and NAND2; on the other hand, the values are maintained when no change occurs in the input values. The transistors T7 and T10 are connected to precharge the differential amplifier and to retain the value of latching while the receiving clock Rxclk is L (low). The transistor T4 is connected in order to prevent the value of the receiving data Rxdata from being reversed due to influences of noise generated by the transistors T7 and T10 although no change occurs in the receiving signals from the receiver coil L2.

FIG. 3 is a view depicting waveforms for describing actions of the present embodiment. A description is given of an action in a case where data are transmitted from the third transmitter circuit 12c on the third LSI chip 11c depicted in FIG. 1 to the first and the second receiver circuits 14a and 14b on the first and the second LSI chips 11a and 11b existing thereon. The case where data transmission of [ . . . LLHHLL . . . ] is carried out as transmission data Txdata is described below as an example. The third transmitter circuit 12c on the third LSI chip 11c inputs a transmission clock Txclk and transmission data Txdata synchronized therewith when transmitting a value. First, in a state where L (Low) is inputted as transmission data Txdata, both of the outputs of the first and the second transmission buffers INV2 and INV3 are in a stationary state in which H (High) is maintained. The first and the second receiver circuits 14a and 14b on the first and the second LSI chips 11b and 11c are in a stationary state with L (Low) outputted to the receiving data Rxdata in a state where L (Low) is continuously inputted.

In this state, the transmission data Txdata changes from L to H at the time of point A. The signal is taken in the memory element FF at point B, and is immediately inputted into the second transmission buffer INV3. Here, although the output of the second transmission buffer INV3 is made L, the output of the first transmission buffer INV2 remains H, wherein a current is caused to flow from the first transmission buffer INV2 to the second transmission buffer INV3. After that, the output of the second transmission buffer INV3 becomes H after the delay time of the delay buffer 121, wherein the outputs of the first transmission buffer INV2 and the second transmission buffer INV3 are made into equal potential, and the current stops flowing. At this time, the drive forces of the first and the second transmission buffers INV2 and INV3 are set so that the current waveform becomes a triangular wave as shown at point B of [transmitter coil current].

Voltages shown in the [first LSI chip receiver coil voltage] and the [second LSI chip receiver coil voltage] are generated in the receiver coil L2 disposed on the first and the second LSI chips 11a and 11b by changes in the current at points B and C of the [transmitter coil current]. The center voltage of the voltage variation is Vbias. Because the first LSI chip 11a is farther from the third LSI chip 11c than the second LSI chip 11b, the voltage generated is lowered. The changes in voltage are amplified by the latched differential amplifier and the value is retained by latching, wherein digital data shown at point B of the [first and second LSI chip Rxdata] are brought about.

The transmission data Txdata on the third LSI chip 11c keeps H at the point B and does not make any change. In this case, the input into the transmitter coil L1 at point C does not change, and the voltage of the receiver coil L2 on the first and the second LSI chips 11a and 11b does not change, wherein the output data Rxdata are maintained.

Where the transmission data Txdata on the third LSI chip 11c shifts from H to L as at point C, the transmission data Txdata are taken in the memory element FF at the point D, and the input into the second transmission buffer INV3 immediately changes from H to L, wherein the output thereof shifts from L to H. At this time, in respect to the output of the first transmission buffer INV2, a change from L to H is delayed by the delay buffer 121, and a current is caused to flow from the second transmission buffer INV3 to the first transmission buffer INV2. After that, the output of the first transmission buffer INV2 becomes H after the delay time of the delay buffer 121, wherein the output voltages of the first transmission buffer INV2 and the second transmission buffer INV3 are made equal to each other, and the current stops. The drive forces of the first and the second transmission buffers INV2 and INV3 are set so that a series of changes in the transmission current becomes a triangular wave which takes an inverted polarity of the triangular wave at point B as at point D of the [transmitter coil current].

Waveforms at point D of the [first LSI chip receiver coil voltage] and [second LSI chip receiver coil voltage] are generated on the receiver coil L2 of the first and the second LSI chips 11a and 11b by a change in the current of the transmitter coil L1 on the third LSI chip 11c. The change in the voltage is amplified by the differential amplifier and converts the same to digital data by latching, whereby digital receiving signals at point D of the [first and second LSI chip Rxdata] are obtained.

In the above, a detailed description has been given of an embodiment of the present invention made by the present inventor. However, the present invention is not limited to the above-described embodiment, but may be subjected to various modifications within the scope not departing from the spirit thereof.

Figure 4A:
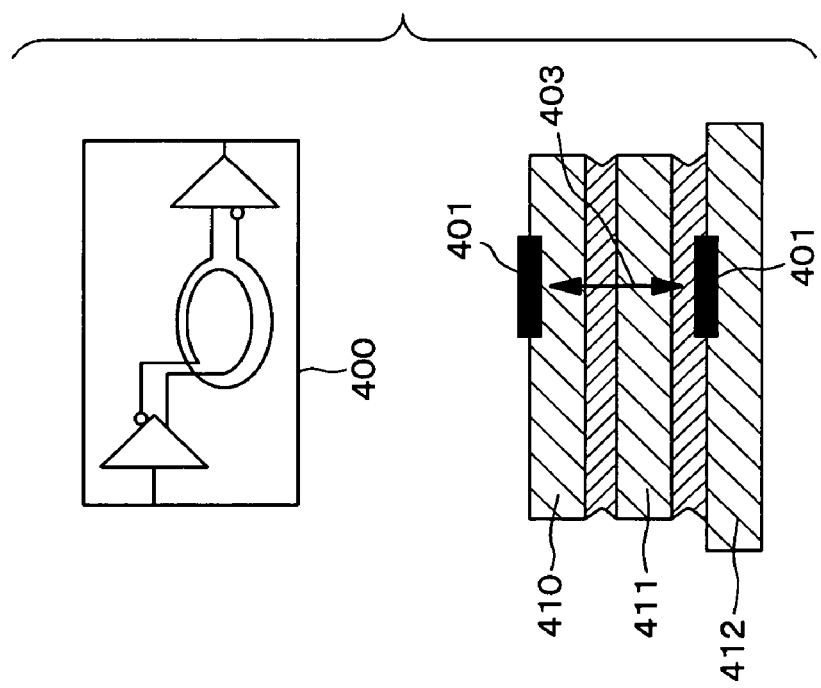
FIGS. 4A and 4B are views depicting a configuration of an electronic circuit according to another embodiment of the present invention.

For example, one-to-one connection is available instead of bus connection. FIG. 4A shows an example of connection of this case. FIG. 4A is a view obtained by observing a stacked LSI composed of the first through the third LSI chips 410 through 412 from its side. The content of the transmitter and receiver circuit 401 is depicted as a transmitter and receiver circuit 400. The arrow 403 denotes inductive coupling.

Figure 4B:
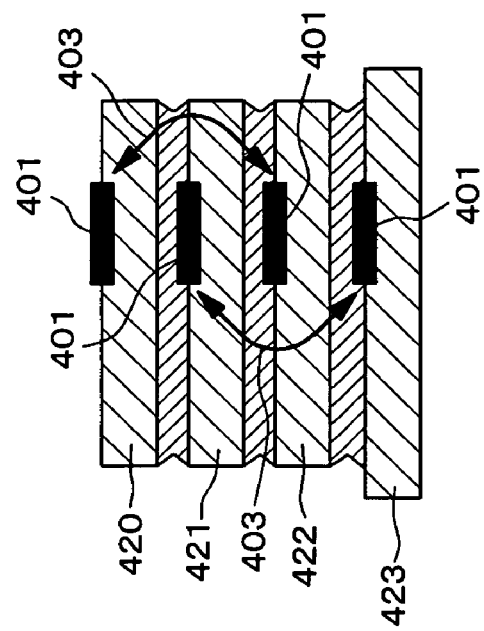

In addition, multiple-to-multiple connection is also available. FIG. 4B shows an example of connection of this case. FIG. 4B is a view obtained by observing a stacked LSI composed of the first through the fourth LSI chips 420 through 430 from its side. In this case, communications between the first LSI chip 420 and the third LSI chip 422 and communications between the second LSI chip 421 and the fourth LSI chip 423 are carried out on the same horizontal position. That is, a plurality of combinations of transmitter circuits and receiver circuits are independently inductively coupled using the same space. Since inductive coupling is enabled on the same horizontal position, for example, respective communications can be carried out without any leakage by time-sharing, etc.

Figure 5:
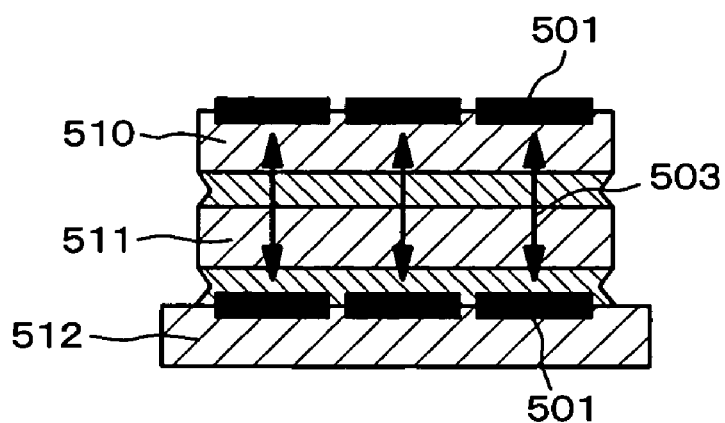
FIG. 5 is a view depicting a configuration of an electronic circuit according to still another embodiment of the present invention.

As described above, expansion can be brought about for not only connections in the vertical direction but also connections in the horizontal direction. FIG. 5 shows an example in which the bandwidth is increased by carrying out communications in parallel. FIG. 5 is a view obtained by observing a stacked LSI composed of the first through the third LSI chips 510 through 512 from its side. The transmitter and receiver circuit 501 is the same as the transmitter and receiver circuit 400 shown in FIG. 4A. The arrow 503 expresses inductive coupling and expresses a state where a plurality of couplings are established in parallel.

Figure 6:
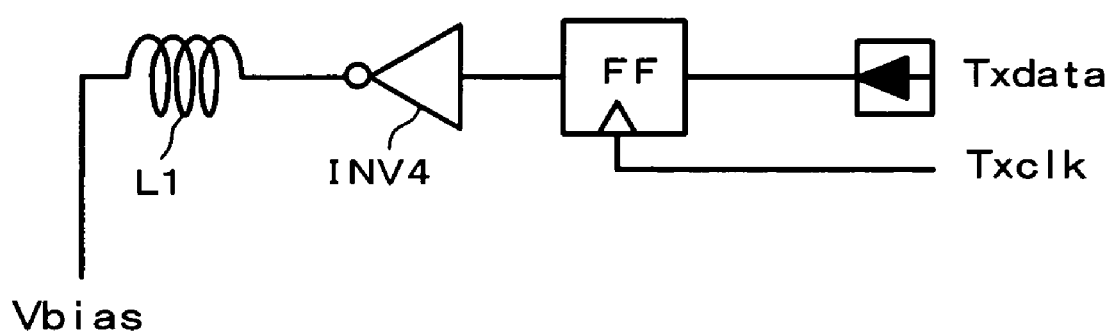
FIG. 6 is a view depicting a detailed configuration of a transmitter circuit according to another embodiment of the present invention.

Further, not only the connection system but also the transmitter and receiver circuit may be altered. Although the power consumption is increased in the transmitter circuit, a configuration depicted in FIG. 6 may be taken if the focus is placed on a decrease in the circuit scale. The transmitter circuit depicted in FIG. 6 is composed of a memory element FF, a transmission buffer INV4 and a voltage source of a bias voltage Vbias. The transmission data Txdata is retained in the memory element FF and is inputted into the transmitter coil L1 via the transmission buffer INV4. The other end of the transmitter coil L1 is connected to the bias voltage Vbias. If the bias voltage Vbias is set to an intermediate voltage between L and H of the transmission data, any one of positive and negative currents is caused to flow to the transmitter coil L1 at all times. However, the current flowing into the transmitter coil L1 is reversed when the transmission data Txdata changes, and signals are transmitted.

In addition, since the receiver circuit is devised so as to receive only the signals for a predetermined cyclic period for which signals are going to be received in synchronization with a receiving clock, noise due to clocks can be removed to increase the SN ratio.

All the publications, patents and patent applications cited in the present specification are taken in the present specification as references.

What is claimed is:

1. An electronic communications circuit comprising:
   a first substrate including a first coil that is formed by wiring on the first substrate, and is connected to a transmitter circuit having a delay element;
   a second substrate including a second coil that is formed by wiring on the second substrate at a position corresponding to said first coil, is inductively coupled to said first coil, and is connected to a first receiver circuit; and
   a third substrate including a third coil that is formed by wiring on the third substrate at a position corresponding to said first and second coils, is inductively coupled to said first and second coils, and is connected to a second receiver circuit;
   said substrates being laminated in order from said first substrate to said third substrate,
   wherein said transmitter circuit changes a potential of one end of said first coil from a first potential to a second potential in response to a change of a transmission digital signal from zero to one, changes a potential of the other end of said first coil from said first potential to said second potential in a predetermined delay, changes a potential of said one end of said first coil from said second potential to said first potential in response to a change of said transmission digital signal from one to zero, and changes a potential of said other end of said first coil from said second potential to said first potential in a predetermined delay; and
   said first and second receiver circuits receive a digital signal transmitted by said transmitter circuit.

2. The electronic communications circuit according to claim 1, wherein said first and second receiver circuits further include two resistors that respectively connect both ends of said first and second coils to one predetermined voltage source.

3. The electronic communications circuit according to claim 1, wherein said first coil is smaller than said second and third coils.

4. An electronic communications circuit comprising:
   a first substrate including a first coil that is formed by wiring on the first substrate, and is connected to a transmitter circuit having a delay element;
   a second substrate including a second coil that is formed by wiring on the second substrate at a position corresponding to said first coil, is inductively coupled to said first coil, and is connected to a first receiver circuit; and
   a third substrate including a third coil that is formed by wiring on the third substrate at a position corresponding to said first and second coils, is inductively coupled to said first and second coils, and is connected to a second receiver circuit,
   said substrates being laminated in order from said first substrate to said third substrate,
   wherein said transmitter circuit connects one end of said first coil to two potentials selectively in response to a transmission digital signal and maintains the other end of said first coil in an intermediate potential between said two potentials; and
   said first and second receiver circuits receive a digital signal transmitted by said transmitter circuit.

5. The electronic communications circuit according to claim 4, wherein said first and second receiver circuits further include two resistors that respectively connect both ends of said first and second coils to one predetermined voltage source.

6. The electronic communications circuit according to claim 4, wherein said first coil is smaller than said second and third coils.

* * * * *